(12) United States Patent
Mann et al.

(10) Patent No.: US 10,818,674 B2
(45) Date of Patent: Oct. 27, 2020

(54) STRUCTURES AND SRAM BIT CELLS INTEGRATING COMPLEMENTARY FIELD-EFFECT TRANSISTORS

(71) Applicant: GLOBALFOUNDRIES Inc., Grand Cayman (KY)

(72) Inventors: Randy W. Mann, Milton, NY (US); Bipul C. Paul, Mechanicville, NY (US); Julien Frougier, Albany, NY (US); Ruilong Xie, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/295,485

(22) Filed: Mar. 7, 2019

(65) Prior Publication Data
US 2020/0286900 A1 Sep. 10, 2020

(51) Int. Cl.
*H01L 27/11* (2006.01)
*H01L 21/8238* (2006.01)
*H01L 29/08* (2006.01)
*H01L 29/66* (2006.01)
*H01L 29/06* (2006.01)
(Continued)

(52) U.S. Cl.
CPC .. *H01L 27/1104* (2013.01); *H01L 21/823807* (2013.01); *H01L 21/823821* (2013.01); *H01L 21/823864* (2013.01); *H01L 27/0924* (2013.01); *H01L 29/0649* (2013.01); *H01L 29/0673* (2013.01); *H01L 29/0847* (2013.01); *H01L 29/6681* (2013.01); *H01L 29/66545* (2013.01); *H01L 29/785* (2013.01)

(58) Field of Classification Search
CPC .................. H01L 27/1104; H01L 27/0924
See application file for complete search history.

(56) References Cited

U.S. PATENT DOCUMENTS 8,597,994 B2   12/2013   Mann
9,012,287 B2    4/2015   Liaw
(Continued)

OTHER PUBLICATIONS

Bipul C. Paul et al., "Circuits Based on Complementary Field-Effect Transistors", U.S. Appl. No. 15/866,855, filed Jan. 10, 2018.

*Primary Examiner* — Farun Lu
(74) *Attorney, Agent, or Firm* — Thompson Hine LLP; Francois Pagette

(57) ABSTRACT

Structures and static random access memory bit cells including complementary field effect transistors and methods of forming such structures and bit cells. A first complementary field-effect transistor has a first storage nanosheet transistor, a second storage nanosheet transistor stacked over the first storage nanosheet transistor, and a first gate electrode shared by the first storage nanosheet transistor and the second storage nanosheet transistor. A second complementary field-effect transistor has a third storage nanosheet transistor, a fourth storage nanosheet transistor stacked over the third storage nanosheet transistor, and a second gate electrode shared by the third storage nanosheet transistor and the fourth storage nanosheet transistor. The first gate electrode and the second gate electrode are arranged in a spaced arrangement along a longitudinal axis. All gate electrodes of the SRAM bitcell may be arranged in a 1CPP layout.

15 Claims, 20 Drawing Sheets

(51) Int. Cl.
*H01L 29/78* (2006.01)
*H01L 27/092* (2006.01)

(56) References Cited

U.S. PATENT DOCUMENTS

| | | |
|---|---|---|
| 9,337,204 B2 | 5/2016 | Calhoun et al. |
| 9,837,414 B1 * | 12/2017 | Balakrishnan ...... H01L 29/1083 |
| 2016/0133633 A1 | 5/2016 | Liaw |
| 2017/0200491 A1 | 7/2017 | Liaw |
| 2018/0323195 A1 * | 11/2018 | Mehandru ............. H01L 21/845 |

* cited by examiner

STRUCTURES AND SRAM BIT CELLS INTEGRATING COMPLEMENTARY FIELD-EFFECT TRANSISTORS

BACKGROUND

The present invention relates to semiconductor device fabrication and integrated circuits and, more specifically, to structures and SRAM bit cells including complementary field effect transistors and methods of forming such structures and bit cells.

Static random access memory (SRAM) may be used, for example, to temporarily store data in a computer system. An SRAM device includes an array of bit cells in which each bit cell retains a single bit of data during operation. Each SRAM bit cell may have a 6-transistor (6T) design that includes a pair of cross-coupled inverters and a pair of access transistors connecting the inverters to complementary bit lines. The two access transistors are controlled by word lines, which are used to select the SRAM memory cell for read or write operations. When continuously powered, the memory state of an SRAM persists without the need for data refresh operations.

Device structures for a field-effect transistor generally include a source, a drain, and a gate electrode configured to switch carrier flow in a channel formed in a semiconductor body between the source and drain. When a control voltage exceeding a designated threshold voltage is applied to the gate electrode, the flow of carriers in the channel between the source and drain produces a device output current.

The body and channel of a planar field-effect transistor are arranged beneath the top surface of a substrate on which the gate electrode is supported. A fin-type field-effect transistor (FinFET) is a non-planar device structure for a field-effect transistor that may be more densely packed in an integrated circuit than planar field-effect transistors. A FinFET includes a fin, heavily-doped source/drain regions, and a gate electrode that wraps around the fin. During operation, a channel for carrier flow is formed in the fin between the source/drain regions. In comparison with planar field-effect transistors, the arrangement between the gate structure and fin improves control over the channel and reduces the leakage current when the FinFET is in its 'Off' state. This, in turn, lowers threshold voltages in comparison with planar field-effect transistors, and results in improved performance and lowered power consumption.

Nanosheet field-effect transistors have been developed as an advanced type of FinFET that may permit additional increases in packing density in an integrated circuit. The body of a nanosheet field-effect transistor includes multiple nanosheet channel layers vertically stacked in a three-dimensional array. Sections of a gate stack may surround all sides of the individual nanosheet channel layers in a gate-all-around arrangement. The nanosheet channel layers are initially arranged in a layer stack with sacrificial layers composed of a material (e.g., silicon-germanium) that can be etched selectively to the material (e.g., silicon) constituting the nanosheet channel layers. The sacrificial layers are etched and removed in order to release the nanosheet channel layers, and to provide spaces for the formation of the gate stack.

A nanosheet field-effect transistor may be used as a base structure to form a complementary field-effect transistor. The source/drain regions of a nanosheet field-effect transistor may be epitaxially grown from the side surfaces of the nanosheet channel layers in spaces between adjacent layer stacks in an array of layer stacks. In a complementary field-effect transistor, epitaxial semiconductor layers of different conductivity type are grown with a stacked arrangement to provide source/drain regions for forming n-type and p-type field-effect transistors connected with each layer stack of nanosheet channel layers.

Improved structures and SRAM bit cells including complementary field effect transistors and methods of forming such structures and bit cells are needed.

SUMMARY

In embodiments of the invention, a static random access memory (SRAM) bit cell includes a first inverter and a second inverter cross-coupled with the first inverter. The first inverter includes a first complementary field-effect transistor having a first shared gate electrode, and the second inverter includes a second complementary field-effect transistor having a second shared gate electrode. The SRAM bit cell further includes a first pass-gate transistor coupled with the first inverter and a second pass-gate transistor coupled with the second inverter. The first pass-gate field-effect transistor has a third gate electrode, and the second pass-gate transistor having a fourth gate electrode. The first shared gate electrode, the second shared gate electrode, the third gate electrode, and the fourth gate electrode are arranged in a one contacted (poly) pitch (1CPP) layout.

In embodiments of the invention, a structure includes a static random access memory bit cell having a first complementary field-effect transistor and a second complementary field-effect transistor. The first complementary field-effect transistor includes a first storage nanosheet transistor, a second storage nanosheet transistor stacked over the first storage nanosheet transistor, and a first gate electrode shared by the first storage nanosheet transistor and the second storage nanosheet transistor. The second complementary field-effect transistor includes a third storage nanosheet transistor, a fourth storage nanosheet transistor stacked over the third storage nanosheet transistor, and a second gate electrode shared by the third storage nanosheet transistor and the fourth storage nanosheet transistor. The first gate electrode and the second gate electrode are arranged in a spaced arrangement along a longitudinal axis.

In embodiments of the invention, a method includes forming a first storage nanosheet transistor and a second storage nanosheet transistor that share a first gate electrode and that are stacked with the second storage nanosheet transistor arranged over the first storage nanosheet transistor, and forming a third storage nanosheet transistor and a fourth storage nanosheet transistor that share a second gate electrode and that are stacked with the fourth storage nanosheet transistor arranged over the third storage nanosheet transistor. The first storage nanosheet transistor and the second storage nanosheet transistor belong to a first complementary field-effect transistor of a static random access memory bit cell. The third storage nanosheet transistor and the fourth storage nanosheet transistor belong to a second complementary field-effect transistor of the static random access memory bit cell. The first gate electrode and the second gate electrode are arranged in a spaced arrangement along a longitudinal axis.

BRIEF DESCRIPTION OF THE DRAWINGS

The accompanying drawings, which are incorporated in and constitute a part of this specification, illustrate various embodiments of the invention and, together with a general description given above and the detailed description given below, serve to explain the embodiments of the invention.

FIGS. 2A-7A are cross-sectional views of the device structure of FIG. 1A at successive fabrication stages subsequent to the fabrication stage of FIG. 1A.

DETAILED DESCRIPTION

Figure 1:
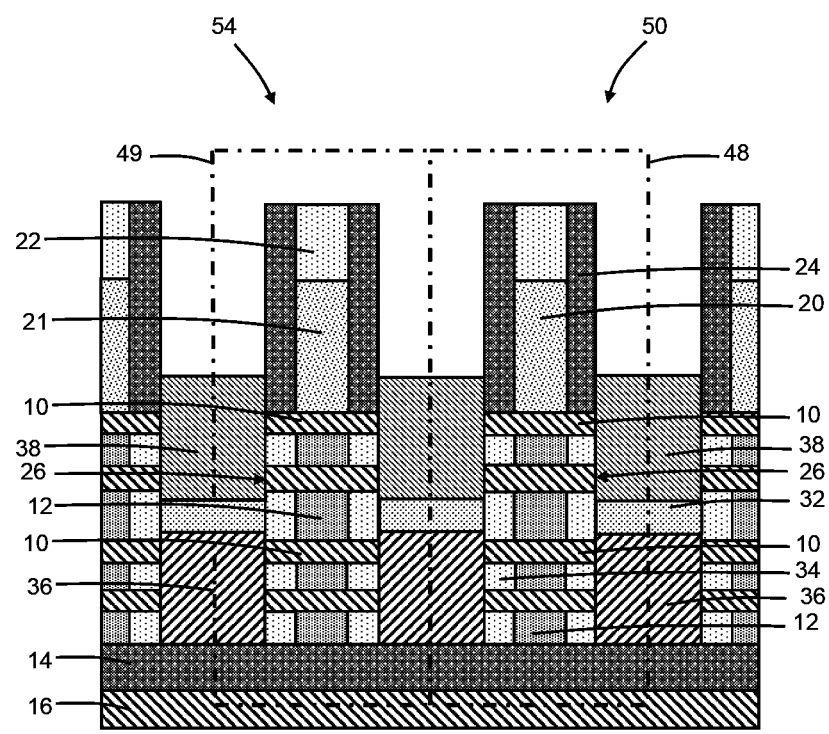
FIG. 1 is a cross-sectional view of a device structure at an initial fabrication stage of a processing method in accordance with embodiments of the invention and taken generally along line 1-1 in FIG. 1E.

With reference to FIGS. 1, 1A-1E and in accordance with embodiments of the invention, body features 26 each include a layer stack containing nanosheet channel layers 10 and sacrificial layers 12 that are alternatingly arranged in a vertical direction with the nanosheet channel layers 10. The body features 26 are positioned over an isolation layer 14, which is in turn is arranged over a substrate 16. The substrate 16 may be composed of a semiconductor material, such as single-crystal silicon.

The nanosheet channel layers 10 of the body features 26 are composed of a semiconductor material, and the sacrificial layers 12 of the body features 26 are composed of a different semiconductor material that is chosen to be selectively removed to the semiconductor material of the nanosheet channel layers 10. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. The nanosheet channel layers 10 and sacrificial layers 12 may be sequentially formed by an epitaxial growth process with the composition alternated during growth through a selection of the reactants to provide the alternating arrangement and then patterned with lithography and etching processes to form the body features 26. In an embodiment, the nanosheet channel layers 10 may be composed of silicon, and the sacrificial layers 12 may be composed of silicon germanium (SiGe) with a germanium content of twenty percent (20%) to sixty percent (60%) that etches at a higher rate than silicon.

Sacrificial gate structures 20, 21 are respectively arranged over the layer stacks including nanosheet channel layers 10 and the sacrificial layers 12. The sacrificial gate structures 20, 21 may be composed of a semiconductor material, such as amorphous silicon, that is deposited by chemical vapor deposition and patterned with reactive ion etching using a hardmask. The sacrificial gate structures 20, 21 are arranged between adjacent sacrificial gate structures (not shown) on the top surface of the topmost nanosheet channel layer 10 of the layer stack. Each of the sacrificial gate structures 20, 21 is cut into segments that are distributed lengthwise in a spaced arrangement. A dielectric cap 22 is arranged over each sacrificial gate structure 20, 21. The dielectric caps 22 may be composed of, for example, silicon nitride.

Dielectric spacers 24 are formed on the top surface of the topmost nanosheet channel layer 10 of the layer stack and are positioned adjacent to the vertical sidewalls of each of the sacrificial gate structures 20, 21 and its dielectric cap 22. The dielectric spacers 24 may be composed of a low-k dielectric material, such as SiBCN or SiOCN. The nanosheet channel layers 10 and sacrificial layers 12 are patterned with an etching process that is self-aligned to the sacrificial gate structures 20, 21 and dielectric spacers 24 to form body features 26 for the field-effect transistors in the device structure.

The isolation layer 14 may be formed following the formation of the body features 26. The isolation layer 14 electrically isolates the nanosheet channel layers 10 and sacrificial layers 12 in each body feature 26 from the substrate 16. For example, the isolation layer 14 may be formed by etching the trenches into the substrate 16 and etching the substrate 16 laterally beneath the body features 26, and then filling with a dielectric material, such as silicon dioxide, that is an electrical insulator.

Shallow trench isolation regions 18 are arranged in the substrate 16 between the body features 26. The shallow trench isolation regions 18 may be formed by forming a pattern of trenches with lithography and etching processes, filling the trenches with a dielectric material, planarizing the dielectric material with chemical mechanical polishing, and recessing the dielectric material with a de-glaze process. The dielectric material may be composed of an electrical insulator, such as silicon dioxide, deposited by chemical vapor deposition.

Inner spacers 34 are arranged inside indents defined in the sidewalls of each body feature 26. To that end, the sacrificial layers 12 are laterally recessed relative to the nanosheet channel layers 10 with a dry or wet isotropic etching process that etches the material constituting the sacrificial layers 12 selective to the material constituting the nanosheet channel layers 10. Because the nanosheet channel layers 10 are not laterally recessed, the lateral recessing of the sacrificial layers 12 generates the indents in the sidewalls of each body feature 26. The inner spacers 34 may be formed by depositing a conformal layer composed of a dielectric material, such as silicon nitride deposited by atomic layer deposition, that fills the indents by pinch-off, and then performing an etching process that removes the conformal layer outside of the indents.

Source/drain regions 36 and source/drain regions 38 are formed in spaces between the sidewalls of adjacent body features 26. As used herein, the term "source/drain region" means a doped region of semiconductor material that can function as either a source or a drain of a nanosheet field-effect transistor. The source/drain regions 36 are physically coupled with the nanosheet channel layers 10 in a lower portion of the body features 26, and the source/drain regions 38 are physically coupled with the nanosheet channel layers 10 in an upper portion of the body features 26. The source/drain regions 36 and the source/drain regions 38 are physically isolated from the sacrificial layers 12 by the inner spacers 34, and the source/drain regions 36 are electrically isolated from the substrate 16 by the isolation layer 14.

The source/drain regions 36 may be formed by an epitaxial growth process in which semiconductor material grows from growth seeds provided by the exposed surfaces of the nanosheet channel layers 10 at the sidewalls of the body features 26 and merges in the space between adjacent body features 26. The semiconductor material constituting the source/drain regions 36 may be heavily doped during epitaxial growth with an n-type dopant (e.g., phosphorus and/or arsenic) that provides n-type electrical conductivity.

After the source/drain regions 36 are formed, a dielectric layer 32 composed of a dielectric material, such as silicon dioxide, is formed over the source/drain regions 36 and in the space around the body features 26. After forming the dielectric layer 32, the source/drain regions 38 may be formed by an epitaxial growth process in which semiconductor material grows from growth seeds provided by the exposed surfaces of the uppermost nanosheet channel layers 10 at the sidewalls of the body features 26 and above the dielectric layer 32, and merges in the space between adjacent body features 26. The semiconductor material constituting the source/drain regions 38 may be heavily doped to have an electrical conductivity that is opposite to the electrical conductivity of the source/drain regions 36. In an embodiment, the semiconductor material constituting the source/drain regions 38 may be doped during epitaxial growth with a p-type dopant (e.g., boron) that provides p-type electrical conductivity.

In each stack, the upper source/drain regions 38 are physically separated from the lower source/drain regions 36 of opposite conductivity-type semiconductor material by a section of the dielectric layer 32 providing electrical isolation. The stacked source/drain regions 36, 38 may be used to form complementary field-effect transistors. To that end, the nanosheet channel layers 10 associated with each of the stacked source/drain regions 36, 38 define a nanosheet transistor that includes the source/drain region 36 of one conductivity type and its connected nanosheet channel layers 10, and another nanosheet transistor that includes the source/drain region 38 of another conductivity type and its connected nanosheet channel layers 10. The epitaxial semiconductor material may be removed in some locations such that only the source/drain regions 36 remain. In these locations, nanosheet transistors may be formed that only include the source/drain regions 36, and that are not characterized as complementary field-effect transistors.

Figure 1A:
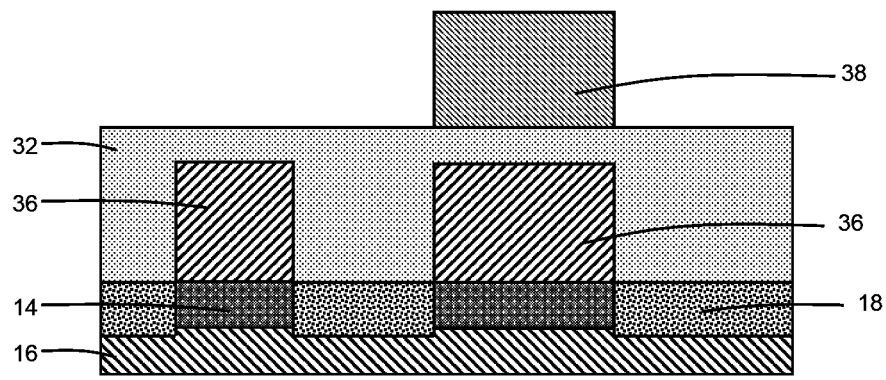
FIG. 1A is a cross-sectional view of the device structure taken generally along line 1A-1A in FIG. 1E.
Figure 1E:
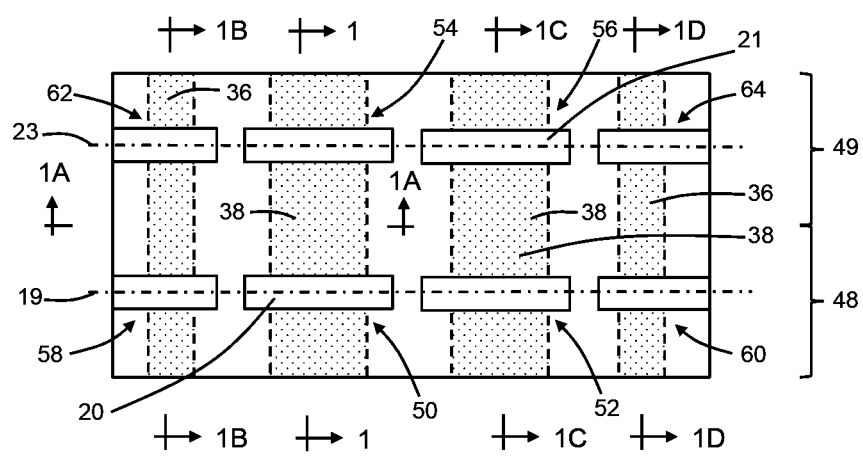
FIG. 1E is a diagrammatic top view of the device structure of FIGS. 1, 1A, 1B, 1C, 1D in which only the sacrificial gate structures and source/drain regions of the different field-effect transistors of the device structure are shown for clarity of description.
Figure 1B:
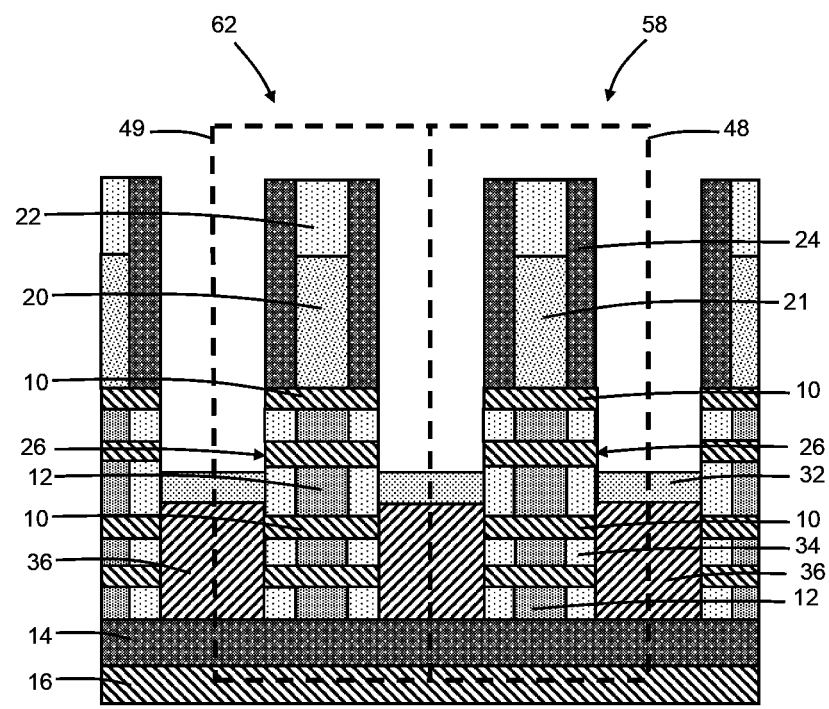
FIG. 1B is a cross-sectional view of the device structure taken generally along line 1B-1B in FIG. 1E.
Figure 1C:
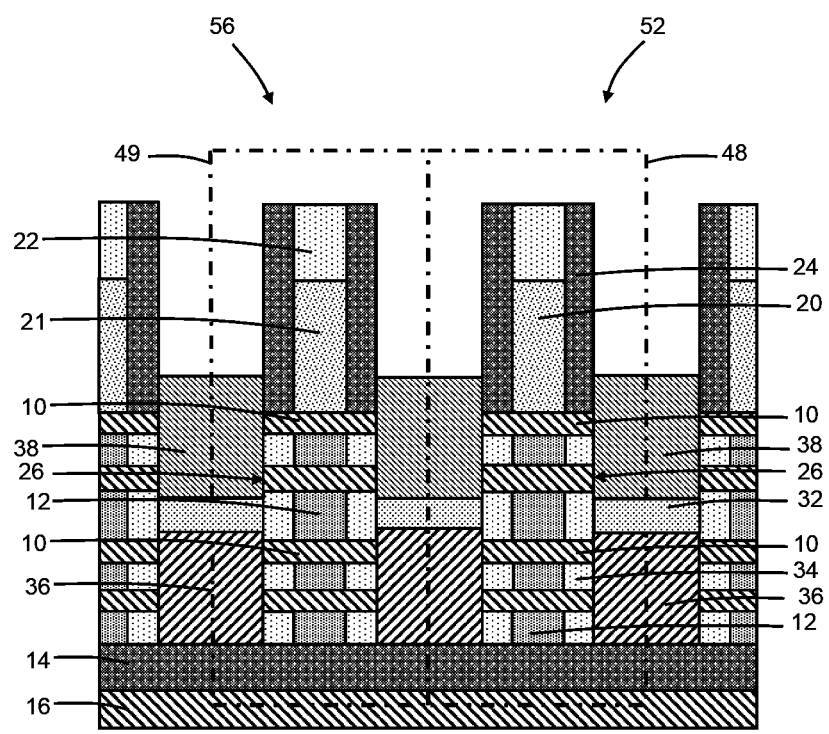
FIG. 1C is a cross-sectional view of the device structure taken generally along line 1C-1C in FIG. 1E.
Figure 1D:
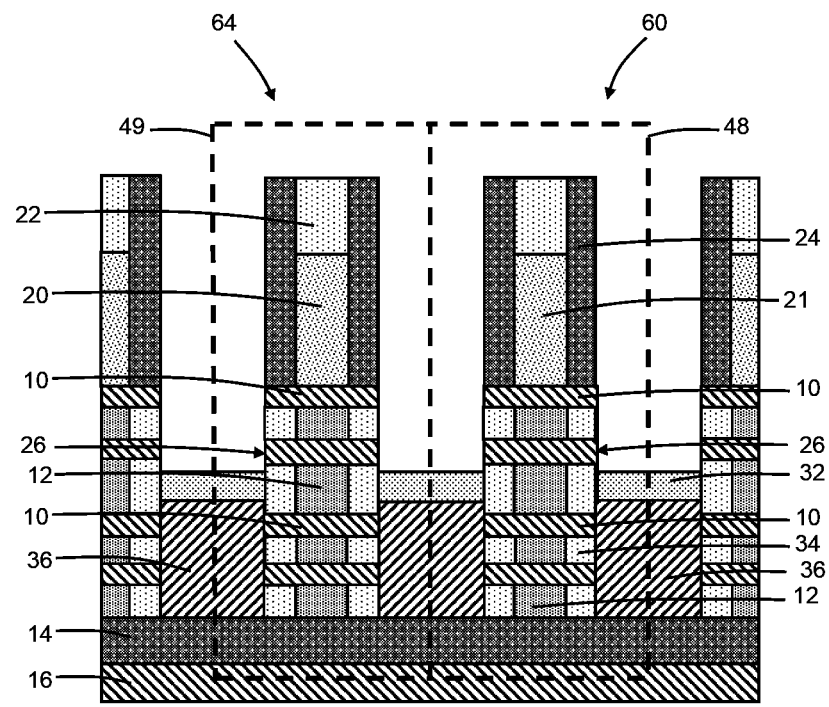
FIG. 1D is a cross-sectional view of the device structure taken generally along line 1D-1D in FIG. 1E.

As best shown diagrammatically in FIG. 1E, device structures, which may be included in respective six transistor (6-T) static random access memory (SRAM) bit cells 48, 49 of an SRAM memory device, may be formed that include the source/drain regions 36, 38, the sacrificial gate structures 20, 21, and the body features 26 between the sacrificial gate structures 20, 21 and the isolation layer 14. At this juncture of the process flow, the sacrificial gate structures 20, 21 represent placeholder dummy structures that are subsequently pulled and replaced by functional gate structures. The SRAM bit cells 48, 49 may belong to a much larger array of SRAM bit cells that are identical to the SRAM bit cells 48, 49. The source/drain regions 36 are located in a layer that is arranged in a vertical direction below a layer that includes source/drain regions 38 with the dielectric layer 34 intervening between the adjacent layers. One of the source/drain regions 38 is stacked over one of the source/drain regions 36 in association with four of the body features 26 to define stacked nanosheet transistor pairs belonging to respective complementary field-effect transistors (CFETs) 50, 52, 54, 56. In each stacked arrangement, the source/drain region 36 contributes to forming a lower nanosheet field-effect transistor of an inverter, and the source/drain region 38 contributes to forming an upper nanosheet field-effect transistor of an inverter.

The CFETs 50, 52 and the CFETs 54, 56 respectively supply the cross-coupled inverters of different SRAM bit cells 48 that provide storage in the SRAM bit cells 48, 49. In an embodiment, the nanosheet field-effect transistors associated with the lower source/drain regions 36 of the CFETs 50, 52, 54, 56 may be characterized as pull-down transistors of the SRAM bit cells 48, 49, and the nanosheet field-effect transistors associated with the upper source/drain regions 38 of the CFETs 50, 52, 54, 56 may be pull-up transistors of the SRAM bit cells 48, 49.

In instances in which the upper source/drain regions 38 are removed, the lower source/drain regions 36 are associated with nanosheet field-effect transistors (NSFETs) 58, 60, 62, 64. In the SRAM bit cell 48, the NSFETs 58, 60 may constitute access or pass-gate transistors of the SRAM bit cell 48 that control access to the cross-coupled CFETS 50, 52 during read and write operations. In the SRAM bit cell 49, the NSFETs 62, 64 may constitute access or pass-gate transistors of the SRAM bit cell 49 that control access to the cross-coupled CFETS 54, 56 during read and write operations.

The six transistors in the SRAM bit cell 48 are arranged with a one contacted (poly) pitch (1CPP) layout that is formed using a single shape provided by the sacrificial gate structure 20. The single shape of the sacrificial gate structure 20, after being formed, is cut into multiple discontinuous sections (e.g., four sections) that are lengthwise arranged along a longitudinal axis 19. The sections of the sacrificial gate structure 20 are distributed and spaced apart at their adjacent ends or tips by gaps resulting from distinct cuts providing the sectioning. Each cut provides a discontinuity in the sacrificial gate structure 20 such that each of the CFETs 50, 52 and the NSFETs 58, 60 includes one of the sections that is subsequently converted into an upper portion of a functional gate structure. One of the sections of the sacrificial gate structure 20 is associated with the CFET 50, another of the sections of the sacrificial gate structure 20 is associated with the CFET 52, another of the sections of the sacrificial gate structure 20 is associated with the NSFET 58, and another of the sections of the sacrificial gate structure 20 is associated with the NSFET 60.

As a result of the 1CPP layout, all six of the transistors and, in particular, the sections of the sacrificial gate structure 20 and their associated body features 26 are aligned lengthwise in a row within the SRAM bit cell 48. The sections of the sacrificial gate structure 20 and the sacrificial layers 12 in each associated body feature 26 are subsequently replaced by sections of a replacement gate structure, and these sections of the replacement gate structure are likewise arranged in the row aligned along the longitudinal axis 19.

The six transistors in the SRAM bit cell 49 are also arranged in a 1CPP layout that is formed using a single shape provided by the sacrificial gate structure 21. The single shape of the sacrificial gate structure 21 is cut into multiple discontinuous sections (e.g., four sections) that are lengthwise arranged along a longitudinal axis 23. The sections of the sacrificial gate structure 21 are spaced apart at their ends or tips by gaps resulting from distinct cuts providing the sectioning. Each cut provides a discontinuity in the sacrificial gate structure 21 such that each of the CFETs 54, 56 and the NSFETs 62, 64 includes one of the sections that is subsequently converted into an upper portion of a functional gate structure. One of the sections of the sacrificial gate structure 21 is associated with the CFET 54, another of the sections of the sacrificial gate structure 21 is associated with the CFET 56, another of the sections of the sacrificial gate structure 21 is associated with the NSFET 62, and another of the sections of the sacrificial gate structure 21 is associated with the NSFET 64.

As a result of the 1CPP layout, all six of the transistors and, in particular, the sections of the sacrificial gate structure 21 and their associated body features 26 are laterally aligned lengthwise in a row within the SRAM bit cell 49. The sections of the sacrificial gate structure 21 and the sacrificial layers 12 in each associated body feature 26 are subsequently replaced by sections of a replacement gate structure, and these sections of the replacement gate structure are likewise arranged in the row aligned along the longitudinal axis 23.

The transistor row of the SRAM bit cell 48 is arranged parallel to, and displaced laterally from, the transistor row of the SRAM bit cell 49. More specifically, the longitudinal axis 19 of the SRAM bit cell 48 is arranged parallel to, and displaced laterally from, the longitudinal axis 23 of the SRAM bit cell 49. Each of the sacrificial gate structures 20, 21 includes three cuts that define the four sections of the six transistors in which two pairs of the transistors are stacked in the CFETs 50, 52 and in the CFETs 54, 56.

A bit line is connected with the NSFETs 58, 62 and a complementary bit line is connected with the NSFETs 60, 64. The 1CPP layout for the SRAM bit cells 48, 49 may operate, due to the compactness of the layout, to reduce the bit line capacitance, in comparison with SRAM bit cells having a 2CPP layout, due to a reduction in the length of the bit line.

For simplicity of description, the subsequent process flow will be described in connection with CFETs 50, 54 with an understanding that the process flow applies equally to CFETs 52, 56.

Figure 2:
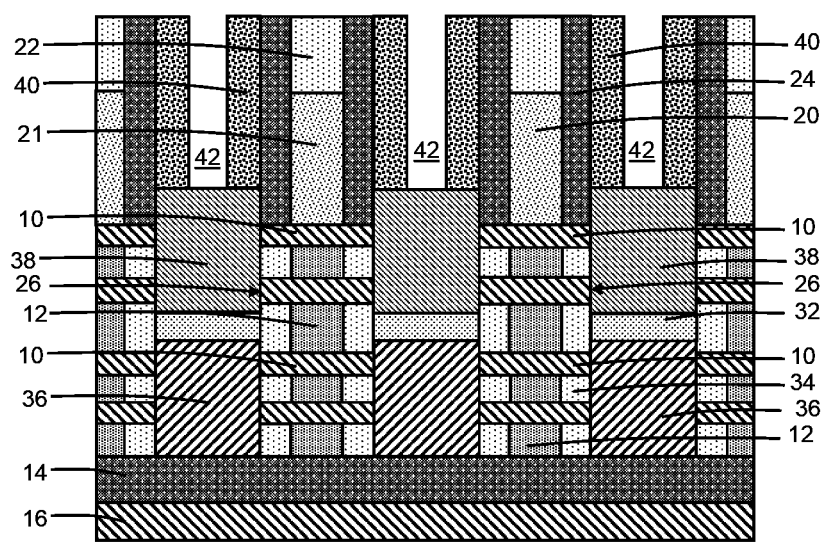
FIGS. 2-7 are cross-sectional views of the device structure of FIG. 1 at successive fabrication stages subsequent to the fabrication stage of FIG. 1.
Figure 2A:
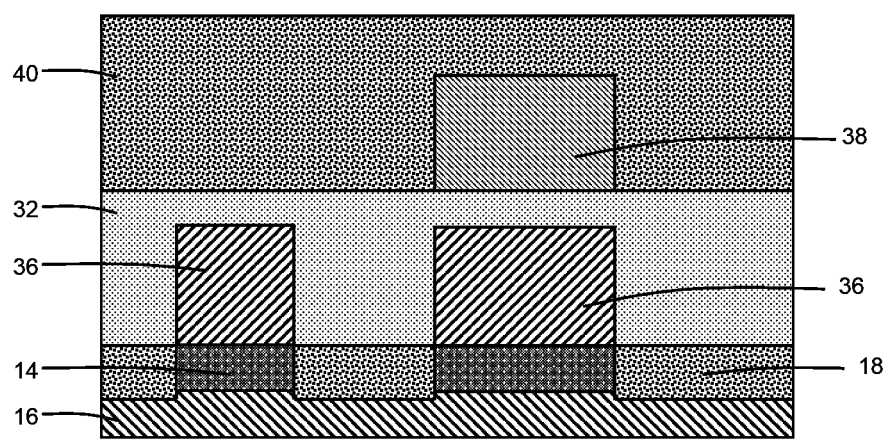

With reference to FIGS. 2, 2A in which like reference numerals refer to like features in FIGS. 1, 1A and at a subsequent fabrication stage of the processing method, the capped sacrificial gate structures 20, 21 and dielectric spacers 24 project above the top surface of the source/drain regions 38, and the dielectric spacers 24 frame open spaces above each of the source/drain regions 38. A dielectric spacer 40 is formed interior of the dielectric spacers 24 over each source/drain regions 38. The dielectric spacers 40 may be formed by depositing a conformal dielectric layer and etching the dielectric layer with an anisotropic etching process, such as reactive ion etching. The dielectric spacers 40 may be composed of an electrical insulator, such as silicon dioxide. The dielectric spacers 40 respectively extend in a vertical direction from the top surface of the source/drain regions 38 and may be coplanar with the dielectric spacers 24 and dielectric caps 22. Open spaces 42 are respectively arranged over each source/drain region 38 interior of the overlying dielectric spacer 40.

Figure 3:
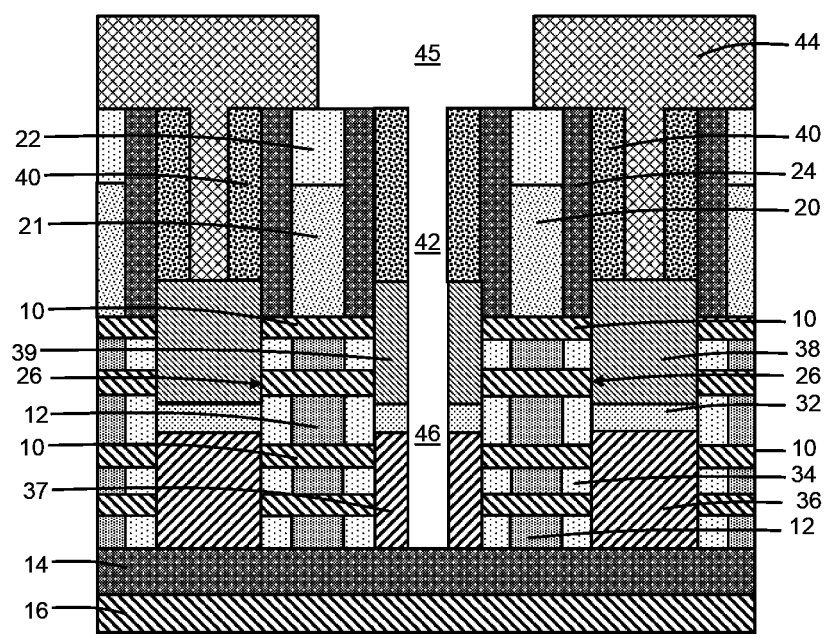
Figure 3A:
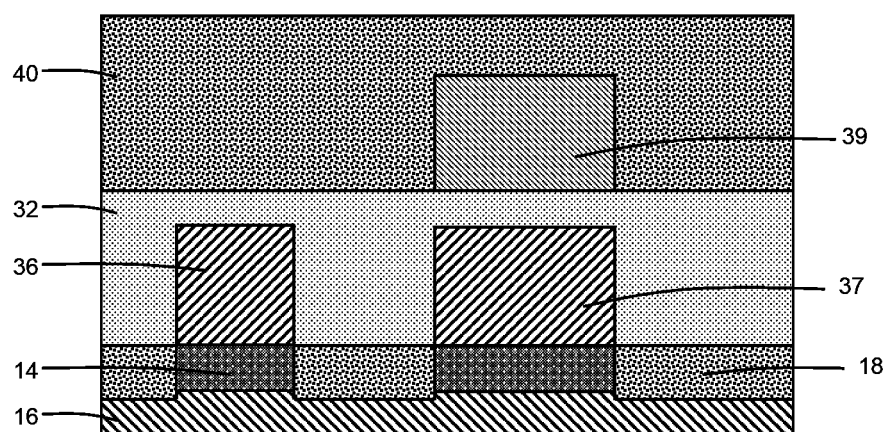

With reference to FIGS. 3, 3A in which like reference numerals refer to like features in FIGS. 2, 2A and at a subsequent fabrication stage of the processing method, an etch mask 44 is applied and patterned to form an opening 45 that is aligned with the open space 42 interior of one instance of the dielectric spacers 40. The etch mask 44 may include a spin-on hardmask (SOH), such as an organic planarization layer (OPL), that is applied by spin coating and patterned by lithography and etching. The materials of the source/drain region 38, the dielectric layer 32, and the source/drain region 36 are successively removed with one or more etching processes, such as reactive ion etching (RIE), selective to the materials of the dielectric spacers 24, the dielectric caps 22, and the isolation layer 14 to define an opening 46 that extends to the isolation layer 14. The dielectric spacer 40 provides self-alignment of location of the opening 46 during the one or more etching processes.

The openings 42, 46 collective define a trench that extends completely through both of the source/drain regions 36, 38 at a location between the different bit cells 48, 49. The divided source/drain region 36 provides source/drain regions 37, and the divided source/drain region 36 provides source/drain regions 39 that are stacked with the source/drain regions 37 and separated from the source/drain regions 37 by respective divided sections of the dielectric layer 32.

Figure 4:
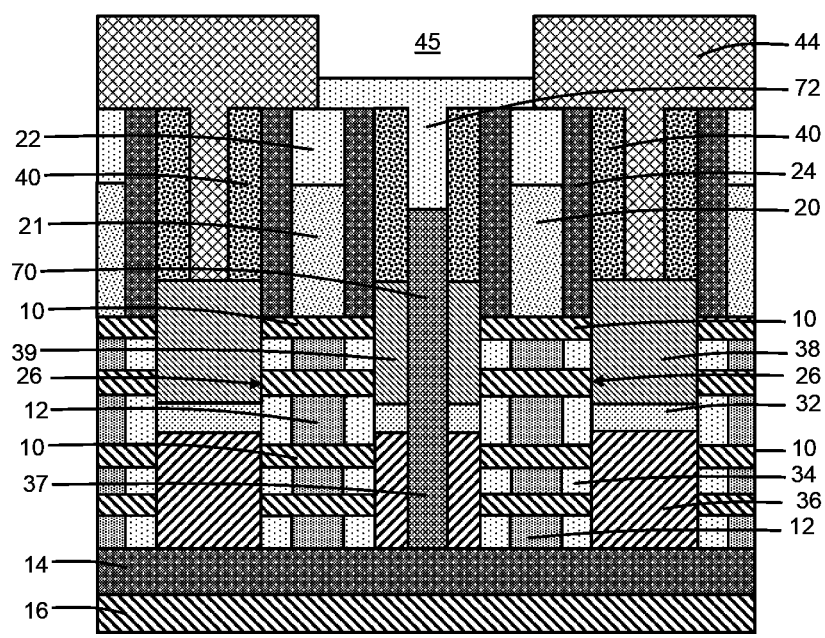
Figure 4A:
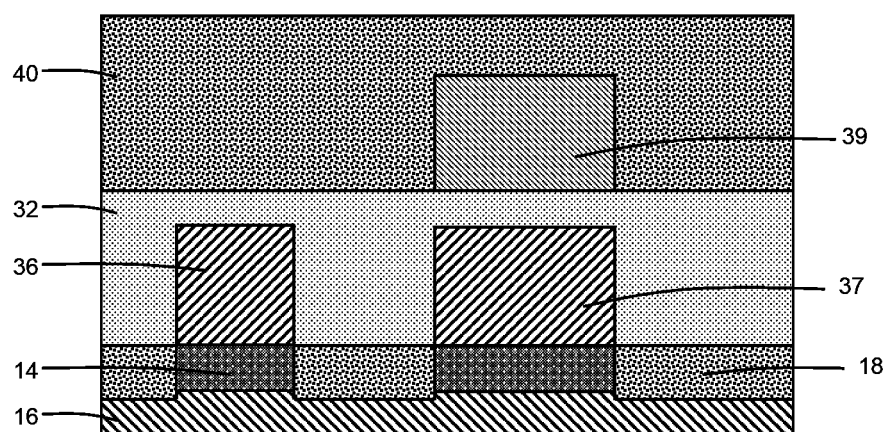

With reference to FIGS. 4, 4A in which like reference numerals refer to like features in FIGS. 3, 3A and at a subsequent fabrication stage of the processing method, a pillar 70 and a pillar cap 72 are formed inside the opening 46. The pillar 70 and pillar cap 72 are composed of different dielectric materials with different dielectric constants and different etch selectivities. In an embodiment, the pillar 70 may be composed of silicon carbide (SiC), and the pillar cap 72 may be composed of silicon nitride. The dielectric material of the pillar 70 may be deposited and etched back to fill the lower section of the opening 46. The dielectric material of the pillar cap 72 may be deposited and etched back to overfill the upper section of the opening 46. The source/drain regions 37, 39 belonging to the different bit cells 48, 49 are arranged on opposite sides of the pillar 70. The source/drain regions 37, 39 of both bit cells 48, 49 are arranged in direct contact with the pillar 70.

Figure 5:
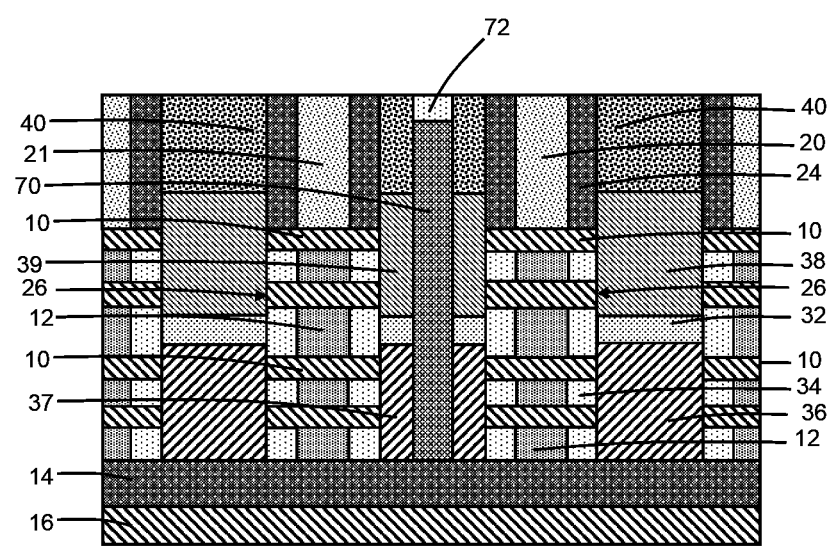
Figure 5A:
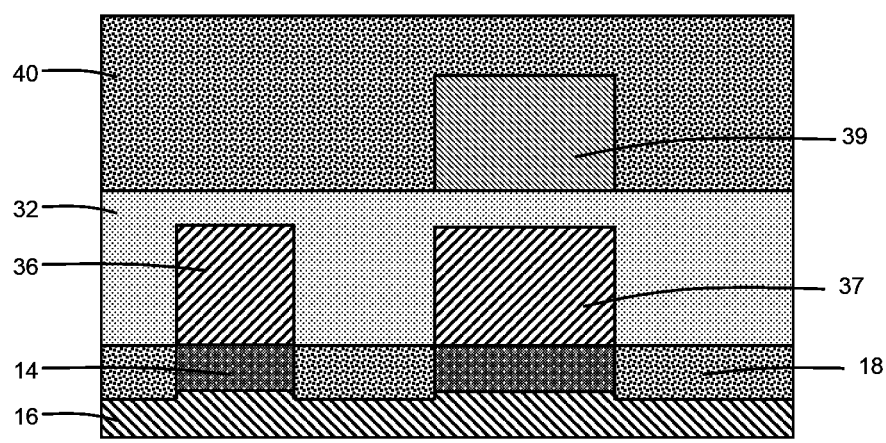

With reference to FIGS. 5, 5A in which like reference numerals refer to like features in FIGS. 4, 4A and at a subsequent fabrication stage of the processing method, the etch mask 44 is removed to reopen the remaining spaces 42 over the source/drain regions 38. The etch mask 44 may be removed by ashing with an oxygen plasma. A dielectric layer 74 is deposited and planarized to file the remaining spaces 42 over the source/drain regions 36, 38 and may be composed of the same dielectric material (e.g., silicon dioxide) as the dielectric spacers 40. The planarization may remove the dielectric caps 22 and expose the sacrificial gate structures 20 for subsequent removal, and may also planarize the pillar cap 72.

Figure 6:
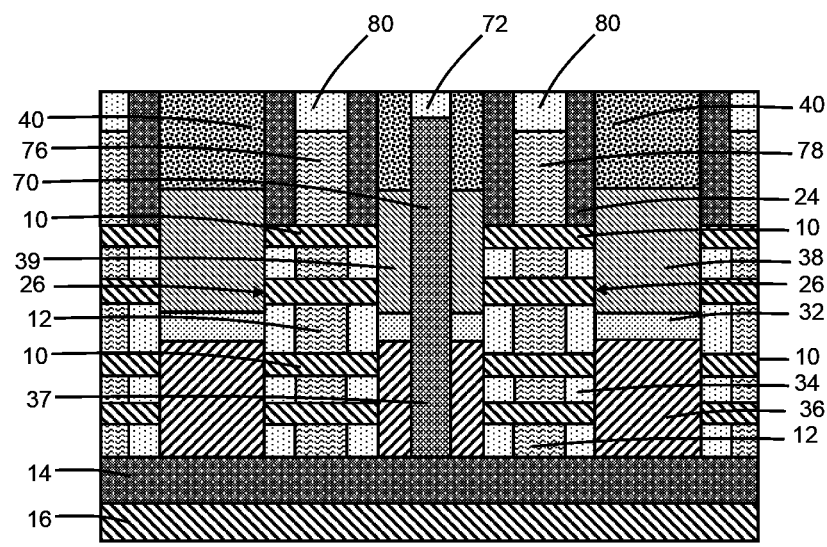
Figure 6A:
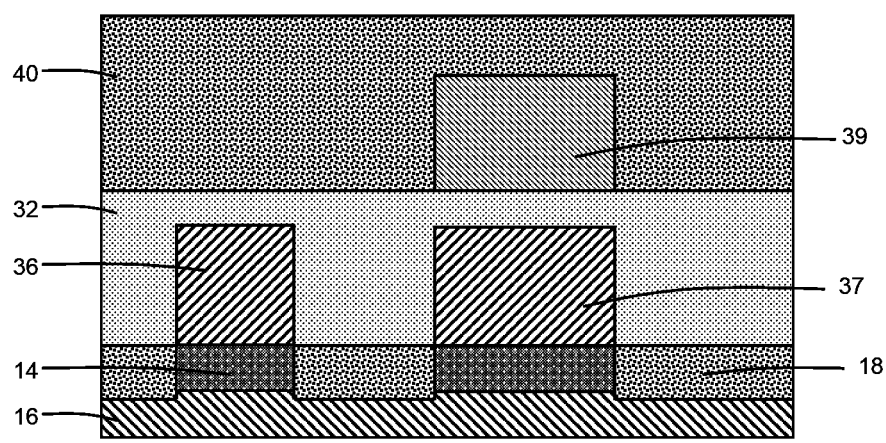

With reference to FIGS. 6, 6A in which like reference numerals refer to like features in FIGS. 5, 5A and at a subsequent fabrication stage of the processing method, a replacement metal gate process is performed to form gate structures 76 for the transistors of the bit cell 49 and gate structures 78 for the transistors of the bit cell 48. To that end, the sacrificial gate structures 20 and sacrificial layers 12 may be sequentially removed with one or more etching processes that remove their materials selective to the materials of the nanosheet channel layers 10 and the inner spacers 34. After removing the sections of the sacrificial gate structure 20 and removing the sacrificial layers 12 to release the associated nanosheet channel layers 10, the sections of the gate structure 78 associated with the CFETs 50, 52 and NSFETs 58, 60 are formed in the spaces opened by their removal. After removing the sections of the sacrificial gate structure 21 and removing the sacrificial layers 12 to release the associate nanosheet channel layers 10, the sections of the gate structure 76 associated with the CETs 54, 56 and NSFETs 62, 64 are formed in the spaces opened by their removal. The pillar cap 72 covers and protects the pillar 70 during the replacement metal gate process.

Each of the gate structures 76, 78 may include a gate dielectric layer (not shown) composed of one or more dielectric materials, such as a high-k dielectric like hafnium oxide and a thin oxide layer on the exterior surfaces of the nanosheet channel layers 10, and a metal gate electrode. The gate dielectric layer is arranged between the metal gate electrode and the exterior surfaces of the nanosheet channel layers 10. The metal gate electrode includes one or more conformal barrier metal layers and/or work function metal layers, such as layers composed of titanium aluminum carbide (TiAlC) and/or titanium nitride (TiN), and a metal gate fill layer composed of a conductor, such as tungsten (W). A gate cap 80 composed of a dielectric material, such as silicon nitride, is formed over each of the gate structures 76, 78.

After the replacement process, the gate structures 78 associated with the CFETs 50, 52 and NSFETs 58, 60 of the bit cell 48 replace the sections of the sacrificial gate structure 20 and the sacrificial layers 12 of their associated body features 26. The gate electrodes of the gate structures 78 associated with the CFETs 50, 52 and NSFETs 58, 60 are aligned along the longitudinal axis 19 in the 1CPP layout, as were the sections of the sacrificial gate structure 20 used as placeholder structures to form the gate structures 78. One of the gate structures 76 has a gate electrode associated with the CFET 50, another of the gate structures 76 has a gate electrode associated with the CFET 52, another of the gate structures 76 has a gate electrode associated with the NSFET 58, and another of the gate structures 76 has a gate electrode associated with the NSFET 60. The gate electrodes of the gate structures 76 associated with the CFETs 54, 56 and NSFETs 62, 64 are aligned along the longitudinal axis 23 in the 1CPP layout, as were the sections of the sacrificial gate structure 20 used as placeholder structures to form the gate structures 76. A gate electrode of one of the gate structures 78 is associated with the CFET 54, a gate electrode of another of the gate electrodes of the gate structures 78 is associated with the CFET 56, a gate electrode of another of the gate structures 78 is associated with the NSFET 62, and a gate electrode of another of the gate structures 78 is associated with the NSFET 64.

Portions of the gate structures 76, 78 are located in the spaces formerly occupied by the removed sacrificial layers 12. These portions of the functional gate structures 76, 78 wrap respective exterior surfaces of the individual nanosheet channel layers 10 in a gate-all-around arrangement. The nanosheet channel layers 10 function as channels for carrier flow during operation of the CFETs 50, 52, 54, 56, as well as channels for carrier flow during the operation of the NSFETs 58, 60, 62, 64.

Figure 7:
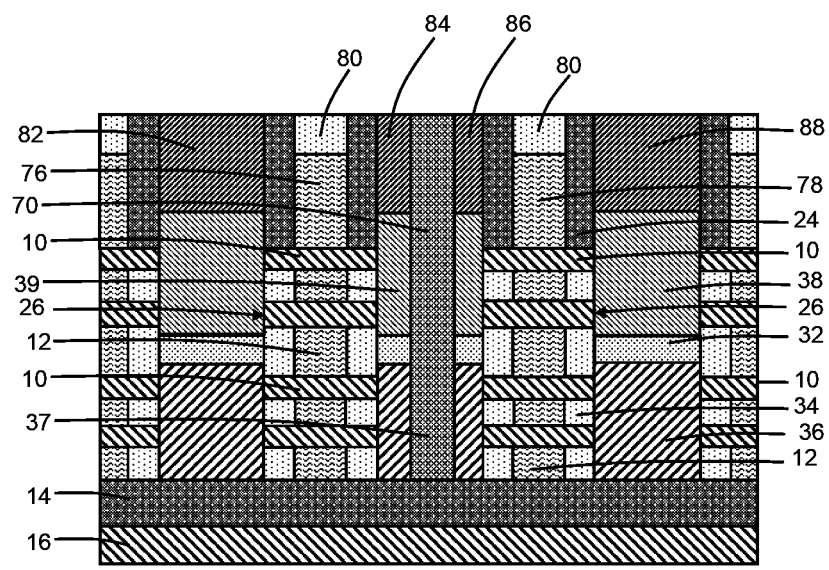
Figure 7A:
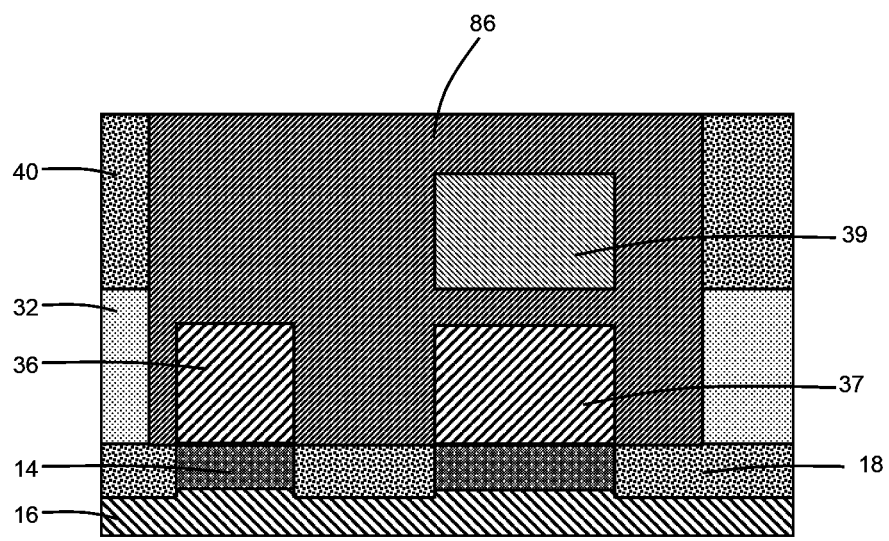

With reference to FIGS. 7, 7A in which like reference numerals refer to like features in FIGS. 6, 6A and at a subsequent fabrication stage of the processing method, contacts 82, 84, 86, 88 are formed in contact openings defined by removing the dielectric spacers 40 and the dielectric layer 74 with a selective etching process. The contacts 82, 84, 86, 88 may include a metal silicide, such as tungsten silicide, titanium silicide, nickel silicide, or cobalt silicide, as well as an overlying conductor, such as tungsten or cobalt. The contacts 82, 84, 86, 88 may be planarized by chemical mechanical polishing with the gate caps 80 operating as a polish stop. The planarization may remove the pillar cap 72, and may also thin the gate caps 80.

The contacts 82 and 88 extend vertically to wrap about the source/drain regions 36, 38 of the CFET 50, 54. The contacts 84 and 86 also extend vertically to wrap about the source/drain regions 37, 39 of the CFETs 50, 54. The contact 84 provides a conductive spacer that is aligned parallel, or substantially parallel, to the longitudinal axis 23, and the contact 86 likewise provides a conductive spacer that is aligned parallel, or substantially parallel, to the longitudinal axis 19. The contact 84 is also wrapped about the source/drain region 36 of the NSFET 58 and thereby connects the stacked source/drain regions 37, 39 of the CFET 50 with the source/drain region 36 of the NSFET 58 to provide a portion of an internal node of the SRAM bit cell 48. Although not shown, another contact 84 connects the stacked source/drain regions 37, 39 of the CFET 52 with the source/drain region 36 of the NSFET 60 to provide a portion of another internal node of the SRAM bit cell 48. A similar set of internal node connections is provided between the CFET 54 and the NSFET 62, and between the CFET 56 and the NSFET 64.

The contacts 84 and 86 are formed in a self-aligned manner with the pillar 70 arranged between the stacked source/drain regions 37, 39 of the CFET 50 and the stacked source/drain regions 37, 39 of the CFET 54. The pillar 70 divides the source/drain regions 37, 39 and the contacts 84, 86 between the CFET 50 and the CFET 54, and another pillar (not shown) divides the source/drain regions 37, 39 and a similar set of contacts (not shown) between the CFET 52 and the CFET 56. The source/drain regions 37, 39 and the contacts 84 belonging to the SRAM bit cell 48 are arranged on one side of the pillar 70 and may be in direct contact with the pillar 70. The source/drain regions 37, 39 and the contacts 86 belonging to the SRAM bit cell 49 are arranged on the opposite side of the pillar 70 and may also be in direct contact with the pillar 70.

Figure 8:
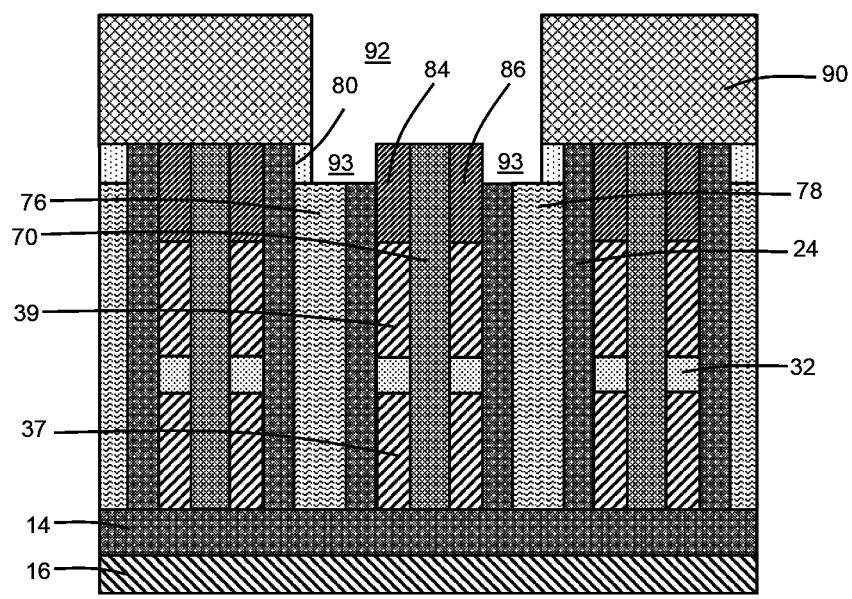
FIG. 8 is a cross-sectional view of a different portion of the device structure at a fabrication stage subsequent to the fabrication stage of FIG. 7.
Figure 8A:
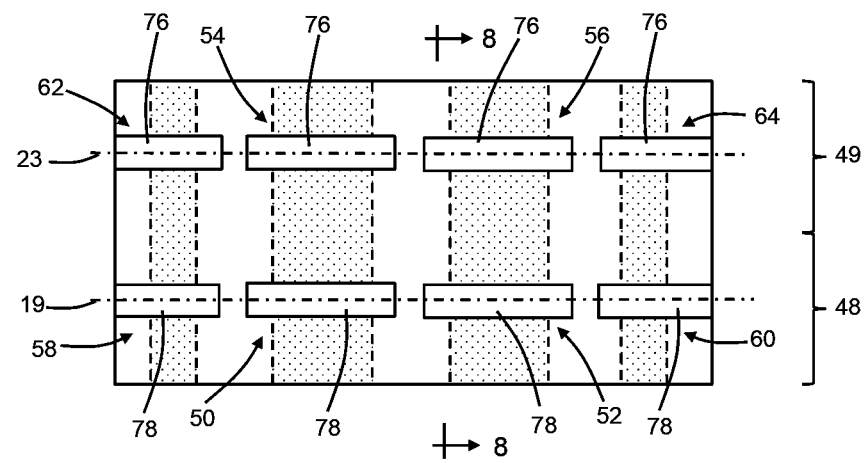
FIG. 8A is a diagrammatic top view of the device structure of FIG. 8 in which only the sacrificial gate structures and source/drain regions of the different field-effect transistors of the device structure are shown for clarity of description.

With reference to FIGS. 8, 8A in which like reference numerals refer to like features in FIGS. 7, 7A and at a subsequent fabrication stage of the processing method, an etch mask 90 is applied and patterned to form an opening 92 that is aligned with the contacts 84, 86 and the gate caps 80 over the gate structures 76, 78. The etch mask 90 may include a spin-on hardmask (SOH), such as an organic planarization layer (OPL), that is applied by spin coating and patterned by lithography and etching.

The gate caps 80 are etched with one or more etching processes, such as reactive ion etching (RIE), to open spaces 93 that expose the respective metal gate electrodes of the gate structures 76, 78. The one or more etching processes also recess the dielectric spacers 24 exposed inside the opening 92. However, the one or more etching processes etch the gate caps 80 selective to the materials of the pillar 70, the gate structures 76, 78, and the contacts 84, 86.

Figure 9:
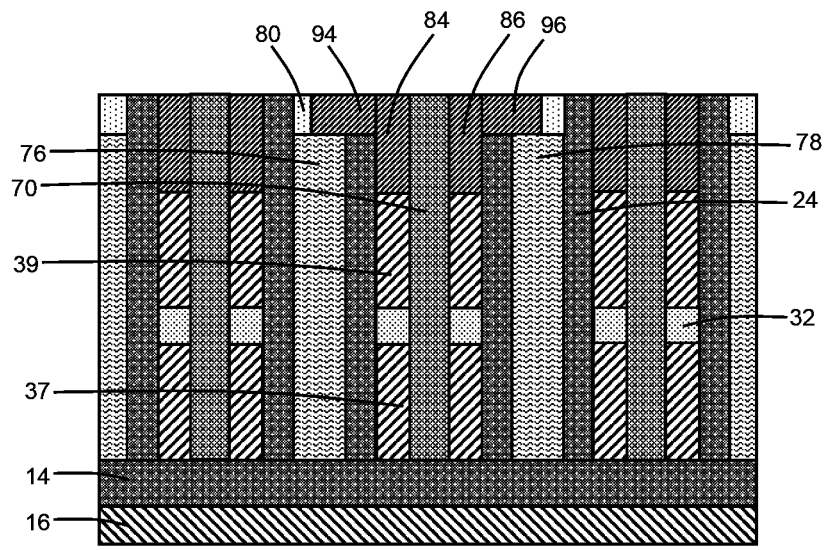
FIG. 9 is a cross-sectional view of the different portion of the device structure at a fabrication stage subsequent to the fabrication stage of FIG. 8.

With reference to FIG. 9 in which like reference numerals refer to like features in FIG. 8 and at a subsequent fabrication stage of the processing method, local interconnects 94, 96 are formed in the spaces 93 (FIG. 8) opened by the one or more etching processes. The local interconnect 94 couples the gate structure 76 with the contact 84 to provide a portion of an internal node for the SRAM bit cell 49. The local interconnect 96 couples the gate structure 78 with the contact 86 to provide a portion of an internal node for the SRAM bit cell 48. The local interconnects 94, 96 may be formed by depositing a conductor, such as tungsten or cobalt, to fill the spaces 93 and then planarizing with chemical-mechanical polishing. The formation of the local interconnects 94, 96 is self-aligned by, in part, the pillar 70, which is arranged laterally between the local interconnects 94, 96 and electrically isolates the local interconnect 94 from the local interconnect 96. The local interconnects 94, 96, which are arranged above the gate structures 76, 78, extend over and across the dielectric spacers 24. The contact 84 also connects the stacked source/drain regions 37, 39 of the CFET 50 with the source/drain region 36 of the NSFET 58 to provide another portion of an internal node of the SRAM bit cell 48, and is also wrapped about the source/drain region 36 of the NSFET 58. Although not shown, another contact 84 connects the stacked source/drain regions 37, 39 of the CFET 52 with the source/drain region 36 of the NSFET 60 to provide a portion of another internal node of the SRAM bit cell 48. Similar connections are provided between the CFET 54 and the NSFET 62, and between the CFET 56 and the NSFET 64.

Figure 10:
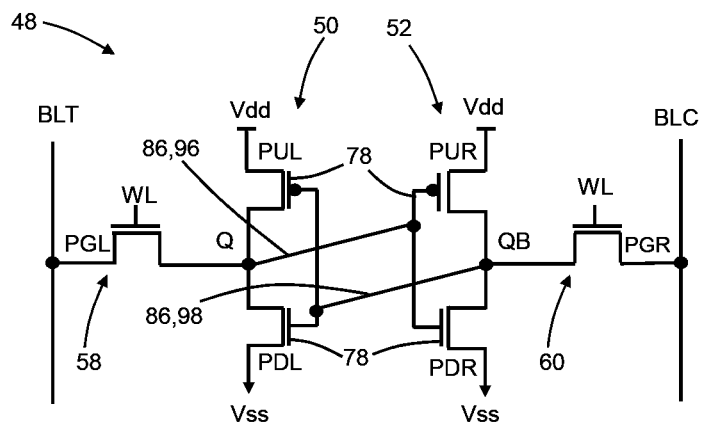
FIG. 10 is a circuit diagram of a 6-transistor SRAM bitcell constructed using the nanosheet transistors and the complementary field-effect transistors.
Figure 11:
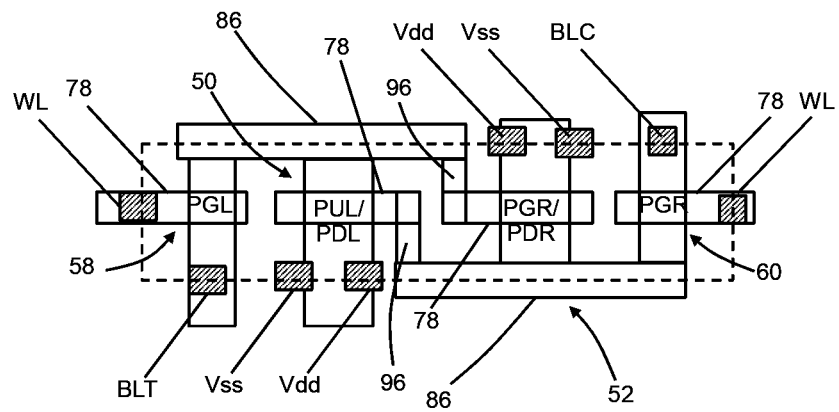
FIG. 11 is a schematic top view of the circuit of the nanosheet transistors and the complementary field-effect transistors showing connections with, and between, the nanosheet transistors and the complementary field-effect transistors of FIG. 10.

With reference to FIGS. 10, 11 in which like reference numerals refer to like features in FIGS. 1-9, the CFETS 50, 52 and NSFETs 58, 60 of the 6-transistor SRAM bit cell 48 of the SRAM memory device are illustrated following middle-of-line processing to form contacts, as diagrammatically indicated by the filled squares in FIG. 11, that are connected with the CFETS 50, 52 and NSFETs 58, 60 of the SRAM bit cell 48. The contacts may be composed of a conductor, such as a silicide and/or tungsten, and may be arranged in respective contact openings formed by lithography and etching processing in a dielectric layer.

The NSFETs 58, 60 represent pass-gate (PG) field-effect transistors, the CFET 50 represents an inverter that includes a pull-up (PUL) transistor and a pull-down (PDL) transistor with stacked source/drain regions 36, 38 and stacked source/drain regions 37, 39, and the CFET 53 represents an inverter that includes a pull-up (PUL) transistor and a pull-down (PDL) transistor with stacked source/drain regions 36, 38 and stacked source/drain regions 37, 39. The contact 86 provides a conductive spacer that connects both the source/drain regions 37, 39 of the CFET 50 and the source/drain region 36 of the NSFET 58 with the local interconnect 96 to provide the internal node for the inverter formed using the CFET 50. Similarly, another contact 86 provides another conductive spacer that connects both the source/drain regions 37, 39 of the CFET 52 and the source/drain region 36 of the NSFET 60 with another local interconnect 96 to provide the internal node for the inverter formed using the CFET 52.

The gates of the PG field-effect transistors (NSFETs 58, 60) are each connected by one or more contacts with a wordline (WL). The source/drain regions 37 of the CFETs 50, 52 are connected with a positive supply voltage ($V_{DD}$) and the source/drain regions 39 of the CFETs 50, 52 are connected with a negative supply voltage ($V_{SS}$), which may be ground. The drain of one of the PG field-effect transistors (NSFET 58) is connected by one or more contacts with a true bit line (BLT). The drain of the other of the PG field-effect transistors (NSFET 60) is connected by one or more contacts with a complementary bit line (BLC). The gate structures 78 of the CFETS 50, 52 and NSFETs 58, 60 are substantially aligned with each other, as discussed herein, in a 1CPP layout.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or "in direct contact with" another feature if intervening features are absent. A feature may be "indirectly on" or "in indirect contact with" another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a static random access memory bit cell including a first complementary field-effect transistor and a second complementary field-effect transistor, the first complementary field-effect transistor including a first storage nanosheet transistor, a second storage nanosheet transistor stacked over the first storage nanosheet transistor, and a first gate electrode shared by the first storage nanosheet transistor and the second storage nanosheet transistor, and the second complementary field-effect transistor including a third storage nanosheet transistor, a fourth storage nanosheet transistor stacked over the third storage nanosheet transistor, and a second gate electrode shared by the third storage nanosheet transistor and the fourth storage nanosheet transistor, the first storage nanosheet transistor of the first complementary field-effect transistor includes a first source/drain region, the second storage nanosheet transistor of the first complementary field-effect transistor includes a second source/drain region arranged over the first source/drain region; and the first gate electrode and the second gate electrode are arranged in a first spaced arrangement along a longitudinal axis;

a conductive spacer aligned substantially parallel to the longitudinal axis, the conductive spacer coupled with the first source/drain region and the second source/drain region; and a first access nanosheet transistor having a third gate electrode, wherein the third gate electrode is aligned with the first gate electrode in a second spaced arrangement along the longitudinal axis.

2. The structure of claim 1 further comprising:
a local interconnect arranged to couple the conductive spacer with the second gate electrode of the second complementary field-effect transistor.

3. The structure of claim 1 further comprising:
a second access nanosheet transistor having a fourth gate electrode,
wherein the fourth gate electrode is aligned with the second gate electrode in a third spaced arrangement along the longitudinal axis, and the first gate electrode and the second gate electrode are laterally arranged between the third gate electrode and the fourth gate electrode.

4. The structure of claim 1 wherein the first access nanosheet transistor further includes a third source/drain region, and the conductive spacer couples the first source/drain region and the second source/drain region with the third source/drain region.

5. The structure of claim 4 further comprising:
an isolation layer comprised of a first dielectric material; and
a pillar comprised of a second dielectric material, the pillar extending in a vertical direction from the isolation layer,
wherein the first source/drain region, the second source/drain region, the third source/drain region, and the conductive spacer are arranged over the isolation layer adjacent to the pillar.

6. A structure comprising:
a static random access memory bit cell including a first complementary field-effect transistor and a second complementary field-effect transistor, the first complementary field-effect transistor including a first storage nanosheet transistor, a second storage nanosheet transistor stacked over the first storage nanosheet transistor, and a first gate electrode shared by the first storage nanosheet transistor and the second storage nanosheet transistor, the second complementary field-effect transistor including a third storage nanosheet transistor, a fourth storage nanosheet transistor stacked over the third storage nanosheet transistor, and a second gate electrode shared by the third storage nanosheet transistor and the fourth storage nanosheet transistor, the first storage nanosheet transistor of the first complementary field-effect transistor including a first source/drain region, and the second storage nanosheet transistor of the first complementary field-effect transistor including a second source/drain region arranged over the first source/drain region;

an isolation layer comprised of a first dielectric material; and a pillar comprised of a second dielectric material, the pillar extending in a vertical direction from the isolation layer, wherein the first gate electrode and the second gate electrode are arranged in a first spaced arrangement along a longitudinal axis, and the first source/drain region and the second source/drain region are arranged over the isolation layer and adjacent to the pillar.

7. The structure of claim 6 wherein the first source/drain region and the second source/drain region are in direct contact with the pillar.

8. The structure of claim 6 further comprising:
a conductive spacer aligned substantially parallel to the longitudinal axis, the conductive spacer coupled with the first source/drain region and the second source/drain region,
wherein the first source/drain region, the second source/drain region, and the conductive spacer are in direct contact with the pillar.

9. The structure of claim 8 further comprising:
a local interconnect arranged to couple the conductive spacer with the second gate electrode of the second complementary field-effect transistor.

10. The structure of claim 6 further comprising:
a first access nanosheet transistor having a third gate electrode,
wherein the third gate electrode is aligned with the first gate electrode in a second spaced arrangement along the longitudinal axis.

11. The structure of claim 10 further comprising:
a second access nanosheet transistor having a fourth gate electrode,
wherein the fourth gate electrode is aligned with the second gate electrode in a third spaced arrangement along the longitudinal axis, and the first gate electrode and the second gate electrode are laterally arranged between the third gate electrode and the fourth gate electrode.

12. A method comprising:
forming a first storage nanosheet transistor and a second storage nanosheet transistor that share a first gate electrode and that are stacked with the second storage nanosheet transistor arranged over the first storage nanosheet transistor;

forming a third storage nanosheet transistor and a fourth storage nanosheet transistor that share a second gate electrode and that are stacked with the fourth storage nanosheet transistor arranged over the third storage nanosheet transistor; and forming a first access nanosheet transistor having a third gate electrode and a second access nanosheet transistor having a fourth gate electrode, wherein the first storage nanosheet transistor and the second storage nanosheet transistor belong to a first complementary field-effect transistor of a static random access memory bit cell, the third storage nanosheet transistor and the fourth storage nanosheet transistor belong to a second complementary field-effect transistor of the static random access memory bit cell, and the first gate electrode and the second gate electrode are arranged in a first spaced arrangement along a longitudinal axis, the third gate electrode is aligned with the first gate electrode with a second spaced arrangement along the longitudinal axis, and the fourth gate electrode is aligned with the second gate electrode with a third spaced arrangement along the longitudinal axis.

13. The method of claim 12 wherein the first storage nanosheet transistor includes a first source/drain region and the second storage nanosheet transistor includes a second source/drain region, and further comprising:
  forming a conductive spacer aligned substantially parallel to the longitudinal axis,
  wherein the conductive spacer couples the first source/drain region with the second source/drain region.

14. The method of claim 12 wherein the first storage nanosheet transistor is arranged on an isolation layer, the isolation layer is comprised of a first dielectric material, and further comprising:
  forming a first source/drain region on the isolation layer;
  forming a second source/drain region over the first source/drain region;
  etching an opening extending through the first source/drain region and the second source/drain region to the isolation layer; and
  depositing a second dielectric material in the opening to define a pillar.

15. The method of claim 13 further comprising:
  forming a local interconnect arranged to couple the conductive spacer with the second gate electrode of the second complementary field-effect transistor.

* * * * *